(12) United States Patent
Ma et al.

(10) Patent No.: US 6,706,612 B2
(45) Date of Patent: Mar. 16, 2004

(54) FABRICATION METHOD FOR SHALLOW TRENCH ISOLATION

(75) Inventors: Szu-Tsun Ma, Hsinchu (TW); Kent Kuohua Chang, Taipei (TW)

(73) Assignee: Macronix International Co., Ltd., Hsinchu (TW)

( * ) Notice: Subject to any disclaimer, the term of this patent is extended or adjusted under 35 U.S.C. 154(b) by 0 days.

(21) Appl. No.: 10/064,370

(22) Filed: Jul. 8, 2002

(65) Prior Publication Data

US 2004/0005765 A1 Jan. 8, 2004

(51) Int. Cl.[7] ................................................ H01L 21/76
(52) U.S. Cl. ................ 438/424; 438/301; 438/305; 438/766; 438/769; 438/787; 438/435; 438/427
(58) Field of Search ................................ 438/424, 301, 438/305, 766, 769, 787, 435, 427

(56) References Cited

U.S. PATENT DOCUMENTS 4,534,824 A * 8/1985 Chen ........................... 438/421
6,261,973 B1 * 7/2001 Misium et al. ............. 438/775

* cited by examiner

*Primary Examiner*—Matthew Smith
*Assistant Examiner*—V. Yevsikov
(74) *Attorney, Agent, or Firm*—Jiang Chyun IP Office

(57) ABSTRACT

A method for fabricating a shallow trench isolation structure includes forming a hard mask layer over a substrate. An ion bombardment step is further performed on the surface of the hard mask layer, followed by forming a patterned photoresist layer on the surface of the hard mask layer. Thereafter, the hard mask layer is patterned using the photoresist layer as an etching mask. An etching process is further performed to form a trench in the substrate. The photoresist layer is then removed, followed by filling an insulation layer in the trench. After this, the hard mask is removed to complete the fabrication of a shallow trench isolation region.

14 Claims, 5 Drawing Sheets

FABRICATION METHOD FOR SHALLOW TRENCH ISOLATION

BACKGROUND OF INVENTION

1. Field of the Invention

The present invention relates to a fabrication method an integrated circuit. More particularly, the present invention relates to a method for fabricating a shallow trench isolation (STI).

2. Description of Related Art

A complete integrated circuit is normally formed with many transistor devices. In order to prevent a circuit shorting between these neighboring transistors, isolated region are formed between the neighboring transistors to isolate the transistors. A typical device isolation region is formed in densely packed semiconductor circuits, for example, between neighboring field effect transistors (FET) in a memory device to reduce the charge leakage of the field effect transistors.

Shallow trench isolation is a trench formed in a semiconductor substrate by employing the technique of anisotropic etching followed by filling the trench with an oxide layer to form an isolation region. Since the isolation region, formed by the shallow trench isolation method, is scalable. Further, the drawback of the bird's beak encroachment in the conventional LOCOS isolation technique is prevented. Therefore, STI is a more favorable isolation technique for the sub-micron metal oxide semiconductor processing.

FIGS. 1A to 1D illustrate the process flow in fabricating a shallow trench isolation region according to the prior art.

Referring to FIG. 1A, the conventional fabrication method for a shallow trench isolation region includes forming a hard mask layer 12 on a substrate. A patterned photoresist layer is then formed on the hard mask layer 12. However, during the patterning of the photoresist layer 14, an interaction is present between the photoresist layer 14 and the hard mask layer 12. The photoresist layer 14 at where the trench is going to be formed can not be cleaned completely. Photoresist residue 16 is thus remained on the hard mask layer 12.

Thereafter, as shown in FIG. 1B, an etching is performed to pattern the hard mask layer 12 using the photoresist layer 14 as an etching mask. Further using the photoresist layer 14 and the hard mask layer 12 as an etching mask, another etching is performed to pattern the substrate 10 to form a trench 18 in the substrate 10. However, in the previous process steps, residue 16 is remained on the surface of the hard mask layer 12. Therefore, during the patterning of the hard mask layer 12 and the substrate 10, the residues 16 needs to be etched completely before the etching of the substrate 10 underneath the residues 16. The presence and absence of resides 16 induce a non-uniform etch rate, and an island defect 20 is thus formed in the trench 18.

Referring to FIG. 1C, the photoresist layer 14 is removed, followed by filling an insulation layer 22 in the trench 18. Thereafter, as shown in FIG. 1D, the mask layer 12 is removed and a shallow trench isolation region is formed. The island defect 20, however, is a silicon material. The presence of the silicon type island defect 20 in the shallow trench isolation region affects not only the isolation capability of the isolation region. If the island defect 20 is formed near the border of the trench 18, a current leakage of the device is easily resulted.

SUMMARY OF INVENTION

Accordingly, the present invention provides a fabrication method for a shallow trench isolation region, wherein an island shaped defect is precluded from forming in the shallow trench isolation region.

The present invention also provides a fabrication method for a shallow trench isolation region, wherein the shallow trench isolation region can effectively isolate the neighboring devices to prevent a current leakage of the device.

The present invention provides a fabrication method for a shallow trench isolation region, wherein a hard mask layer is formed over a substrate. An ion bombardment process is performed on the surface of the hard mask layer. The plasma gas used in the ion bombardment process includes nitrous oxide ($N_2O$), oxygen ($O_2$), nitrogen ($N_2$) or argon (Ar). The ion bombardment process is performed at a temperature of about 200 degrees Celsius to 500 degrees Celsius, under a pressure of about 3 mTorr to 2 Torr and with a power of 100 W to 1000 W. Further, the gas flow rate of the ion bombardment process is about 150 sccm to about 3000 sccm. A photoresist layer is then formed on the ion-bombarded hard mask layer, followed by an exposure process and a development process to pattern the hard mask layer, wherein the area where the trench is going to be formed is exposed. Since the hard mask layer is already treated with the ion bombardment process, the exposed photoresist layer can be completely removed during the exposure process and no residue remains on the hard mask layer. After this, using the photorsist layer as an etching mask, the hard mask layer is patterned. Further using the photoresist layer and the hard mask layer as an etching mask, the substrate is patterned to form a trench in the substrate. Thereafter, the photoresist layer is removed, followed by filling the trench with an insulation layer. The hard mask is further removed to complete a formation of a shallow trench isolation structure.

The fabrication method for a shallow trench isolation region of the present invention includes forming a hard mask layer over a substrate. A thin material layer, e.g., a thin oxide layer, is then formed on the surface of the hard mask layer. A photoresist layer is further formed on the thin oxide layer. An exposure and development process is then performed to pattern the photoresist layer, wherein the region where the trench is going to be formed is exposed. Since the interaction between the thin oxide layer and the photoresist layer is weaker, the exposed photoresist layer can be completely cleaned during the development of the photoresist layer. No residue is remaining on the thin oxide layer. Then, using the photresist layer as an etching mask, the hard mask layer is patterned. Further using the photoresis layer and the hard mask layer as an etching mask, the substrate is patterned to form a trench in the substrate. In other aspect of the present invention, the photoresist layer can be first removed, followed by patterning the substrate to form a trench in the substrate, using the hard mask layer as an etching mask. Thereafter, the photoresist further removed to complete a formation of a shallow trench isolation region.

The present invention provides a method for fabricating a shallow trench isolation region, wherein an ion bombardment process is performed on the surface of the hard mask layer to prevent the photoresist residue remaining and to further prevent the formation of an island defect in the shallow trench isolation region.

The present invention provides a fabrication method for a shallow trench isolation region, wherein a thin material layer is formed on the surface of the hard mask layer to prevent the photoresist residue remaining and to further prevent the formation of an island defect in the shallow trench isolation region.

The fabrication method for a shallow trench isolation region of the present invention prevents the formation of an island defect to raise the isolation effect of the shallow trench isolation region and to effectively prevent a current leakage.

It is to be understood that both the foregoing general description and the following detailed description are exemplary, and are intended to provide further explanation of the invention as claimed.

BRIEF DESCRIPTION OF DRAWINGS

The accompanying drawings are included to provide a further understanding of the invention, and are incorporated in and constitute a part of this specification. The drawings illustrate embodiments of the invention and, together with the description, serve to explain the principles of the invention. In the drawings.

DETAILED DESCRIPTION

FIGS. 2A to 2F are schematic, cross-sectional views illustrating the process flow for fabricating a shallow trench isolation region according to an embodiment of the present invention.

Figure 1A:
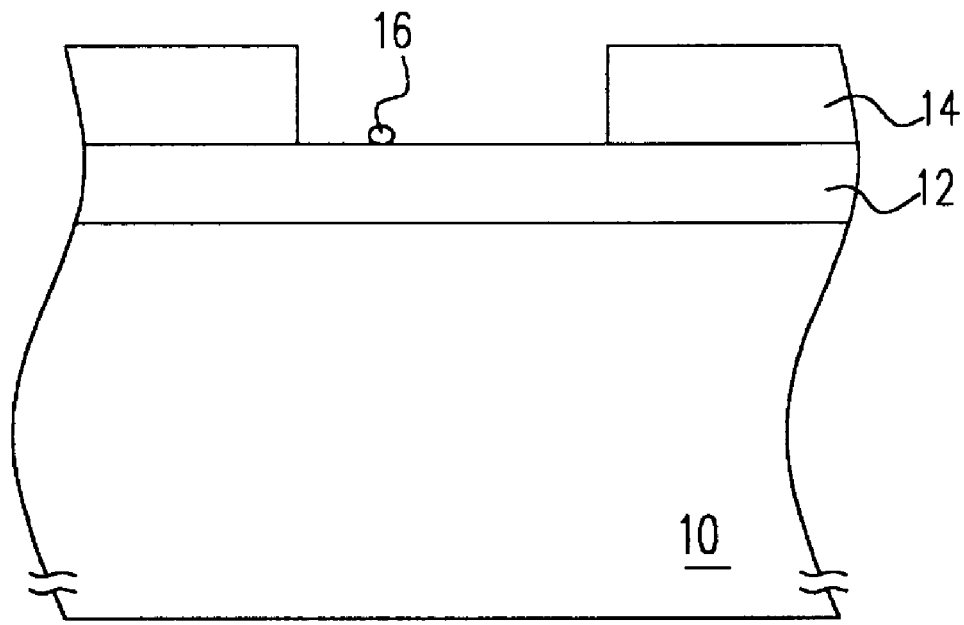
FIGS. 1A to 1D are schematic cross-sectional views illustrating the process flow for fabricating a shallow trench isolation region according to the prior art.
Figure 1B:
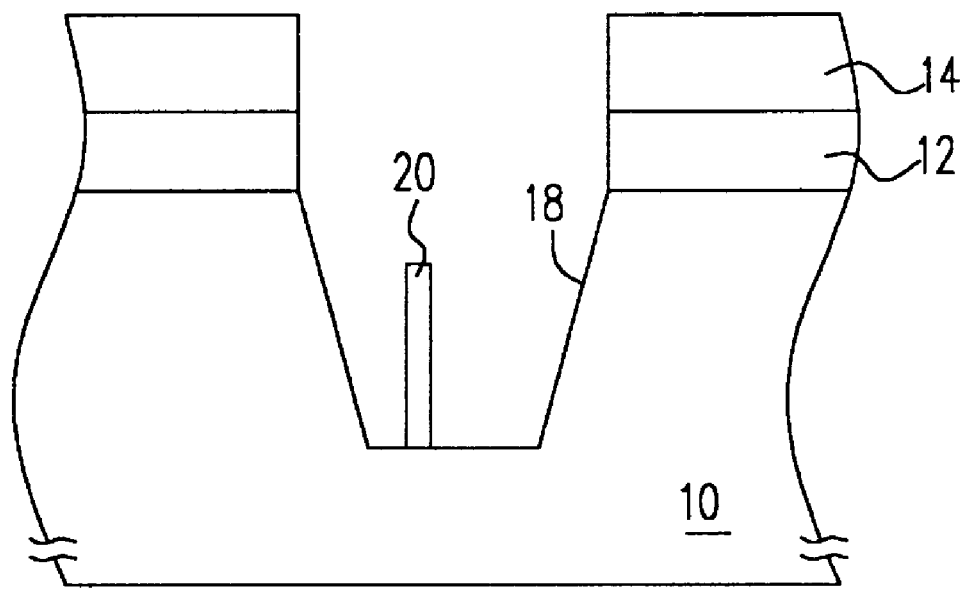
Figure 1C:
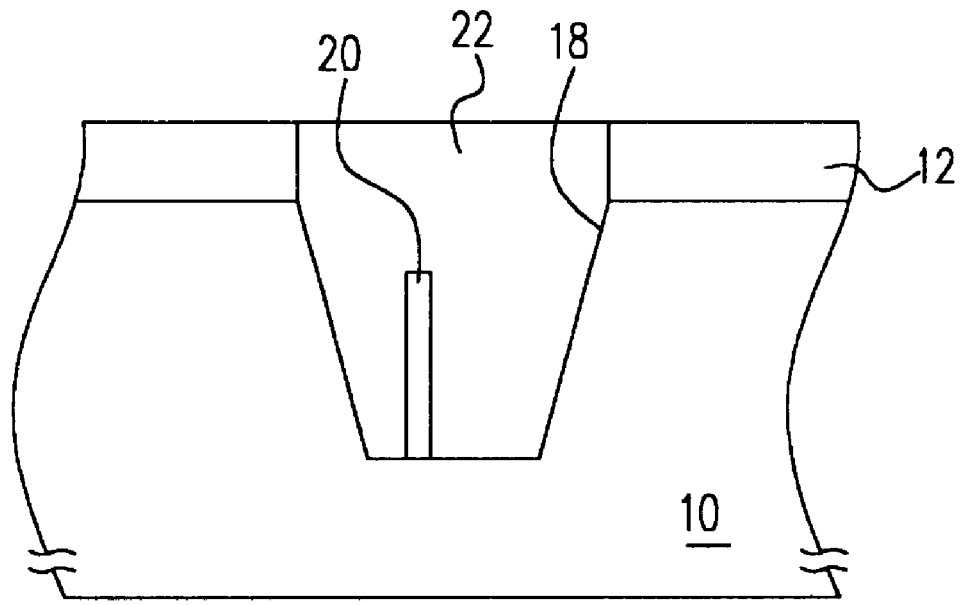
Figure 1D:
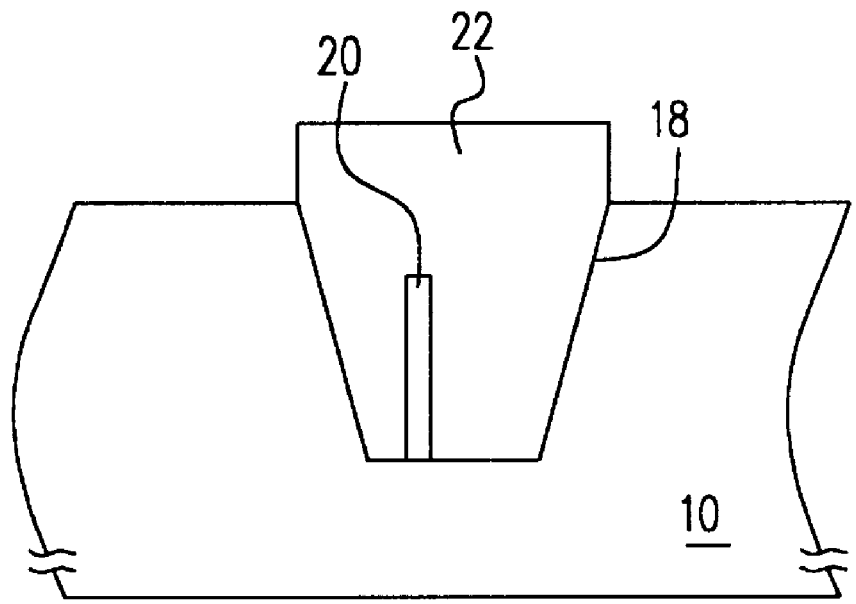
Figure 2A:
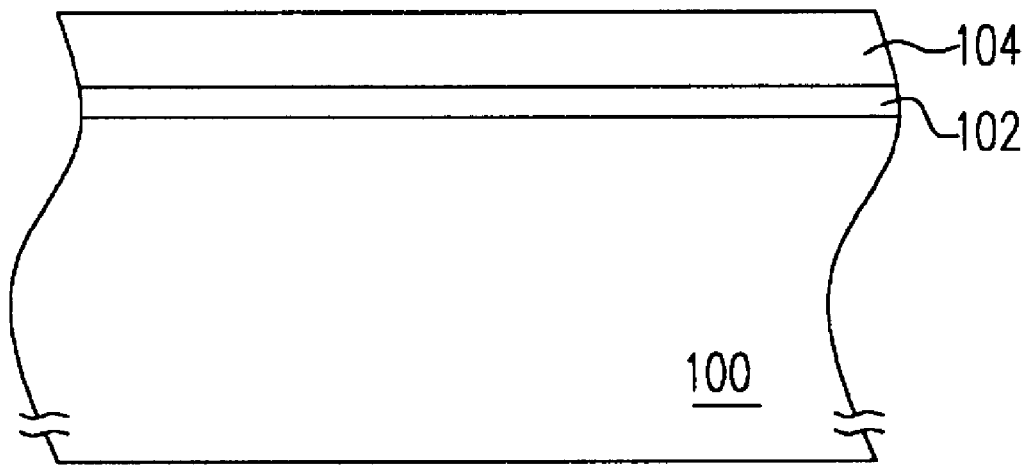
FIGS. 2A to 2F are schematic, cross-sectional views illustrating the process flow for fabricating a shallow trench isolation region according to an embodiment of the present invention.

As shown in FIG. 2A, a semiconductor substrate 100 is first provided. Thereafter, a pad oxide layer 102 is formed on the surface of the substrate to protect the surface of the substrate 100, wherein the pad oxide layer 102 is formed by a thermal oxidation method. After this, a hard mask layer 104 is formed on the pad oxide layer 102. In this embodiment, the hard mask layer 104 includes silicon nitride.

Figure 2B:
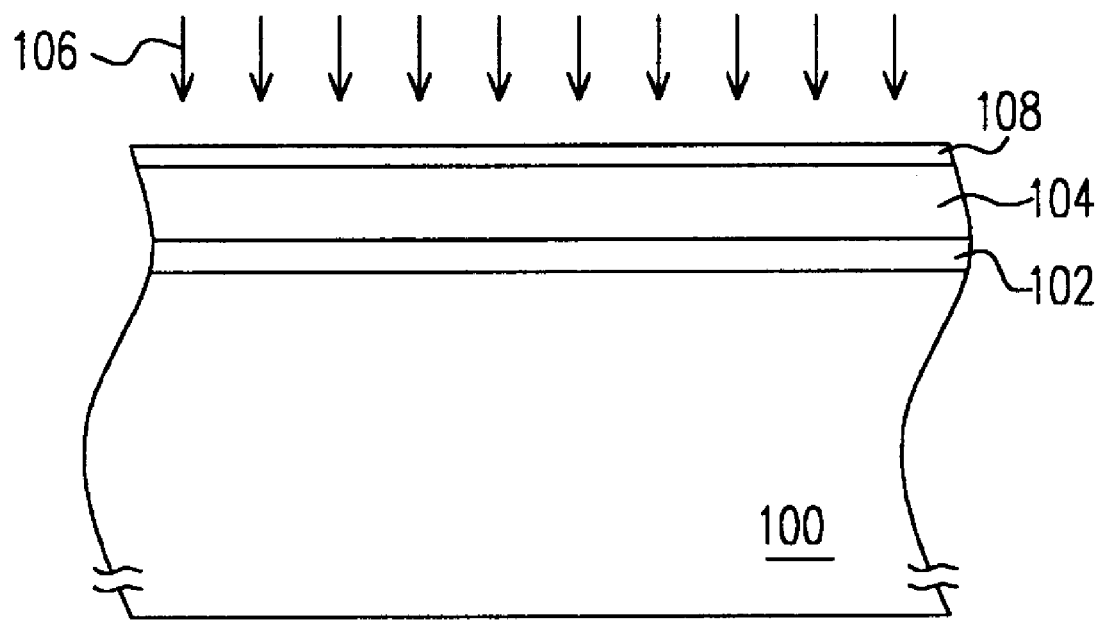

As shown in FIG. 2B, an ion bombardment process 106 is performed to treat the surface of the hard mask layer 104 to form an ion bombarded surface 108 on the surface of the hard mask layer 104.

In the present embodiment, the plasma gas used in the ion bombardment process 106 includes $N_2O$, $O_2$, $N_2$ or Ar. The ion bombardment process 106 is conducted at a temperature of 200 degrees Celsius to 500 degrees Celsius, under a pressure of 3 mTorr to 2 Torr and with a power of about 100 W to about 1000 W. The gas flow rate of the ion bombardment process 106 is about 150 sccm to about 3000 sccm.

Figure 2C:
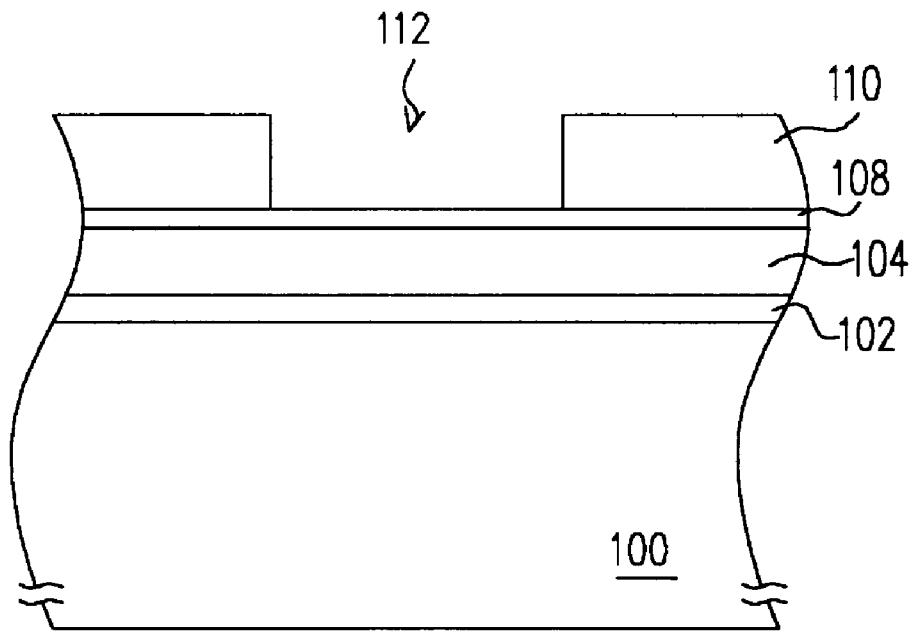

Referring to FIG. 2C, a photoresist layer 110 is formed on the ion bombarded surface 108 of the hard mask layer 104. After this, an exposure and development process is performed to pattern the photoresist layer 110 to form an opening 112, wherein the opening 112 in the photoresist layer 110 exposes the pre-determined trench region.

A point worth noting is that, in the above development process, the photoreisist layer 110 in the opening 112 is completely cleaned. The reason is the surface of the hard mask layer 104 is already subjected to an ion bombardment treatment. The interaction between the surface 108 of the hard mask layer 104, after being subjected to an ion bombardment treatment, and the exposed photoresist layer 110 becomes very weak. The exposed photoresist layer 110 can be completely cleaned subsequent to a development process and will not remain the on surface of the hard mask layer 104.

Figure 2D:
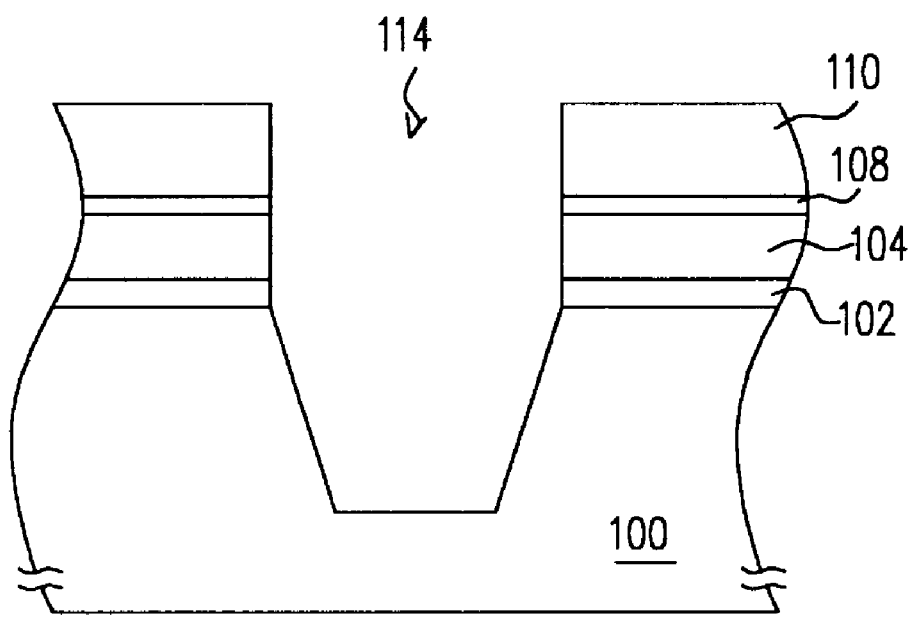

Continuing to FIG. 2D, using the photoresist layer 110 as an etching mask to perform an etching process, removing the hard mask layer 104 exposed by the opening 112. Further using the photoresist layer 110 and the hard mask layer 104 as an etching mask, another etching is performed to pattern the substrate 100 to form a trench 114 in the substrate 100.

In the present invention, the photoresist layer 110 can be removed, followed by using the hard mask layer 104 as an etching mask to form the trench 114 in the substrate 100.

Figure 2E:
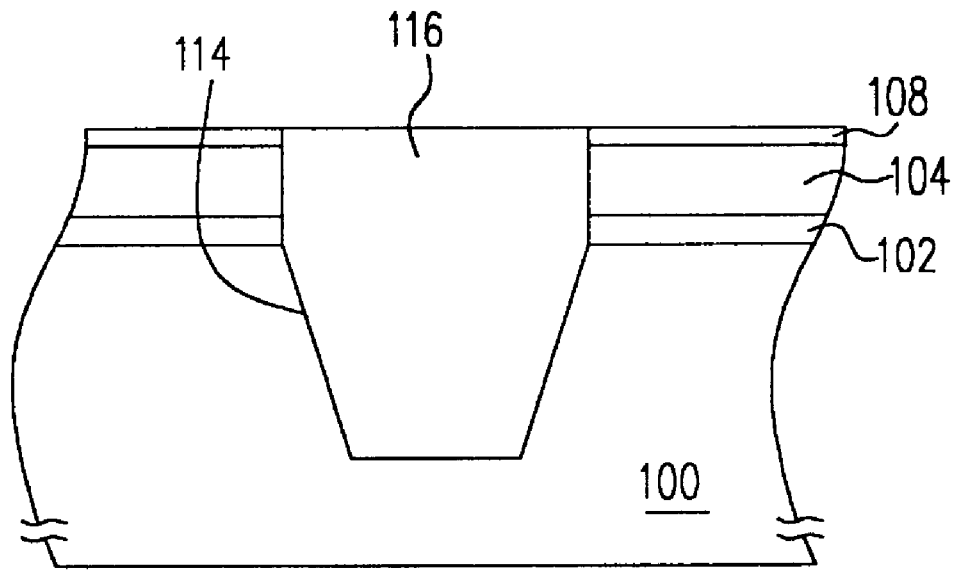
Figure 2F:
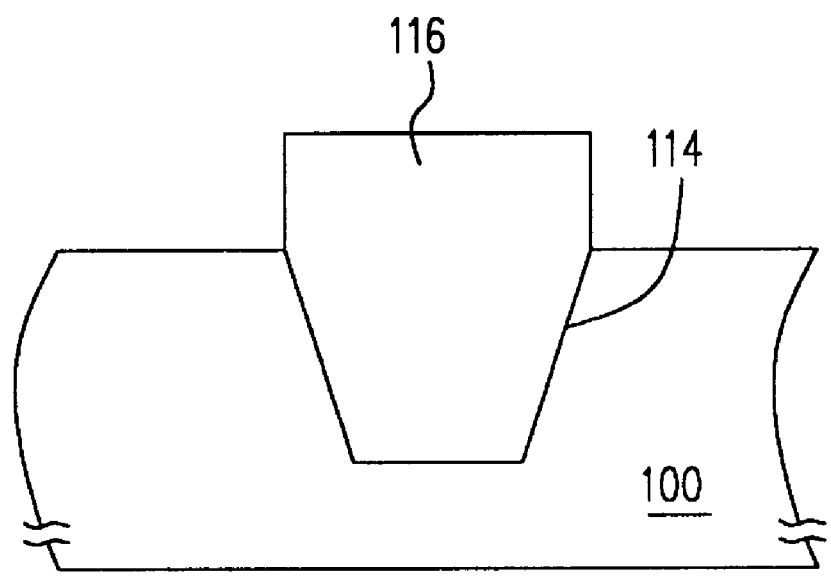

Continuing to FIG. 2E, the photoresist layer 110 is removed. The trench 114 is then filled with an insulation layer 116, wherein the insulation layer 116 includes silicon oxide. Filling the trench 114 with the insulation layer 116 comprises depositing globally an insulation material on the substrate 100, followed by chemical mechanical polishing or back etching a portion of the insulation material until the hard mask layer 104 is exposed. Continuing to FIG. 2F, subsequent to filling the trench 114 with an insulation material, the hard mask layer 104 and the pad oxide layer 102 are removed to complete the formation of a shallow trench isolation structure.

The method for fabricating a shallow trench isolation region of the present invention employs an ion bombardment process 106 to treat the surface 108 of the hard mask layer 104, weakening the interaction between the hard mask layer 104 and the photoresist layer 110. Consequently, in the subsequent development process for the photoresist layer 110, the photoresist layer 110 at the opening 112 is completely removed, obviating any photoresist layer 110 residue remaining on the surface of the hard mask layer 104. Since the photoresist layer 110 will not remain on the surface 108 of the hard mask layer 104, an island defect is prevented from forming in the trench 114 when the substrate 100 is etched to form the trench 114.

Another point worth noting is that, the present invention employs other method to weaken the interaction between the photoresist layer and the surface of the hard mask layer in order to completely remove the exposed photoresist layer. For example, a thin material layer, for example a thin oxide layer, is formed on the surface of the hard mask layer, followed by forming a thin oxide layer on the photoresist layer. In other words, the previous ion bombardment treatment process on the surface of the hard mask layer is replaced by the formation of the oxide layer. Since the interaction between an oxide layer and a photoresist layer is weaker than that between a silicon nitride hard mask layer and the photoresist layer. Forming a thin oxide layer can also lower the interaction between the photoresist layer and the hard mask layer to prevent the formation of an island defect in the trench.

In accordance to the fabrication method for a shallow trench isolation region of the present invention, an ion bombardment treatment is performed on the surface of the hard mask layer to prevent photoresist residues remaining in order to prevent the formation of an island shape defect in the shallow trench isolation region.

Further, a thin material layer is formed on the surface of the hard mask layer according to the method for fabricating a shallow trench isolation region of the present invention, photoresist residue is prevented from remaining behind to prevent the formation of an island shape defect in the shallow trench isolation region.

Further, according to the fabrication method for a shallow trench isolation region of the present invention, an island shape defect is prevented from forming to raise the isolation effect of a shallow trench isolation region to prevent a current leakage of a device.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A method for fabricating a shallow trench isolation region, comprising:
    forming a hard mask layer over a substrate, wherein the hard mask layer is formed with a material comprising silicon nitride;
    performing an ion bombardment process on a top surface of the hard mask layer;
    forming a patterned photoresist layer on the surface of the hard mask layer;
    patterning the hard mask layer using the photoresist layer as an etching mask;
    performing an etching process to form a trench in the substrate;
    removing the photoresist layer;
    filling the trench with an insulation layer; and
    removing the hard mask layer to form a shallow trench isolation region.

2. The method of claim 1, wherein a plasma gas for the ion bombardment process comprises nitrous oxide, oxygen, nitrogen or argon.

3. The method of claim 1, wherein the ion bombardment process is conducted at a temperature of about 200 degrees Celsius to about 500 degrees Celsius.

4. The method of claim 1, wherein a gas flow rate of the ion bombardment process is about 150 sccm to about 3000 sccm.

5. The method of claim 1, wherein the ion bombardment process is performed under a pressure of about 3 mTorr to about 2 Torr.

6. The method of claim 1, wherein the ion bombardment process is performed with a power of about 100 W to about 1000 W.

7. The method of claim 1, wherein the insulation layer is formed with a material comprising silicon oxide.

8. The method of claim 1, wherein before forming the hard mask layer, the method further comprises forming a pad oxide layer on a surface of the substrate.

9. A method for preventing a formation of an island defect, comprising:
    forming a hard mask layer over a substrate, wherein the hard mask layer is formed with a silicon nitride material;
    performing a treatment step on a top surface of the hard mask layer to weaken an interaction between the hard mask layer and a photoresist material;
    forming a patterned photoresist layer on the hard mask layer; and
    patterning the substrate to form an opening in the substrate, using the patterned photoresist layer as an etching mask.

10. The method of claim 9, wherein the treatment step includes an ion bombardment process.

11. The method of claim 10, wherein a plasma gas for the ion bombardment process includes $N_2O$, $O_2$, $N_2$ or Ar.

12. The method of claim 10, wherein the ion bombardment process is conducted at a temperature of about 200 degrees Celsius to about 500 degrees Celsius.

13. The method of claim 9, wherein the treatment step includes forming a thin oxide layer on the hard mask layer.

14. The method of claim 9, wherein before forming the hard mask layer, the method further comprises forming a pad oxide layer over the substrate.

* * * * *